(12) United States Patent
Gutmann et al.

(10) Patent No.: US 12,424,402 B2
(45) Date of Patent: Sep. 23, 2025

(54) ELECTRIC DEVICE COMPRISING A SEALED HOUSING HAVING A LOWER HOUSING PART AND AN UPPER HOUSING PART

(71) Applicant: Tyco Electronics Austria GmbH, Vienna (AT)

(72) Inventors: Markus Gutmann, Vienna (AT); Guenther Deimling, Vienna (AT); Bernd Wesely, Vienna (AT)

(73) Assignee: TE Connectivity Austria GmbH, Waidhofen an der Thaya (AT)

( * ) Notice: Subject to any disclaimer, the term of this patent is extended or adjusted under 35 U.S.C. 154(b) by 0 days.

(21) Appl. No.: 17/525,332

(22) Filed: Nov. 12, 2021

(65) Prior Publication Data

US 2022/0157545 A1     May 19, 2022

(30) Foreign Application Priority Data

Nov. 13, 2020   (EP) ..................................... 20207564

(51) Int. Cl.
   *H01H 45/02*     (2006.01)
(52) U.S. Cl.
   CPC ....... *H01H 45/02* (2013.01); *H01H 2223/002* (2013.01); *H01H 2229/036* (2013.01)
(58) Field of Classification Search
   CPC ............. H01H 45/02; H01H 2223/002; H01H 2229/036; H01H 49/00; H01H 50/023;
   (Continued)

(56) References Cited

U.S. PATENT DOCUMENTS

| 5,079,387 A | 1/1992 | Weaver et al. |
| 5,892,174 A | 4/1999 | Hirawata |
| (Continued) | | |

FOREIGN PATENT DOCUMENTS

| CN | 1547427 A | 11/2004 |
| CN | 109585225 A | 4/2019 |
| (Continued) | | |

OTHER PUBLICATIONS

Extended European Search Report, App. No. 20207564.4, dated May 6, 2021, 7 pages.
(Continued)

*Primary Examiner* — Lheiren Mae A Caroc
(74) *Attorney, Agent, or Firm* — Barley Snyder

(57) ABSTRACT

An electric device includes an electric component and a housing having a lower housing part and an upper housing part. The electric component is supported on the lower housing part. The lower housing part and the upper housing part surround a housing volume in which the electric component is sealingly encased. A weld is formed between the upper housing part and the lower housing part. One of the lower housing part and the upper housing part has a protrusion welded to the other one of the lower housing part and the upper housing part. A gap is disposed between the lower housing part and the upper housing part, the gap extending radially from the protrusion to an outside of the housing. A solidified molten material from the weld is at least partially received in the gap.

21 Claims, 2 Drawing Sheets

(58) Field of Classification Search
CPC ........ H01H 50/04; H01R 43/20; H01R 13/66; H05K 5/02; H05K 5/06; H05K 5/066
USPC ................ 200/302.1, 359.1, 612, 678, 4.02; 220/359.1, 612, 678, 4.02
See application file for complete search history.

(56) References Cited

U.S. PATENT DOCUMENTS

| | | | |
|---|---|---|---|
| 6,252,479 B1* | 6/2001 | Kern | H01H 50/14 335/124 |
| 10,996,544 B2 | 5/2021 | Alonso Oliva | |
| 11,094,489 B2 | 8/2021 | Sandoval et al. | |
| 2008/0278045 A1 | 11/2008 | Fan et al. | |
| 2008/0278892 A1* | 11/2008 | Chen | H05K 5/066 361/724 |
| 2013/0189024 A1 | 7/2013 | Kobayashi | |
| 2017/0093077 A1 | 3/2017 | Kwan et al. | |

FOREIGN PATENT DOCUMENTS

| | | |
|---|---|---|
| CN | 111193847 A | 5/2020 |
| DE | 19627844 C1 | 8/1997 |
| DE | 10256254 A1 | 6/2004 |
| DE | 102017106727 A1 | 10/2018 |
| DE | 202018105148 U1 | 11/2018 |
| EP | 1016515 A2 | 7/2000 |
| JP | S61049484 U | 3/1986 |
| JP | 2000268663 A | 9/2000 |
| JP | 2000514235 W | 10/2000 |
| JP | 2013153046 A | 8/2013 |
| JP | 2015139272 A | 7/2015 |
| TW | 433066 U | 5/2001 |
| WO | 9801880 | 1/1998 |

OTHER PUBLICATIONS

Office Action from Japan's Patent Office dated Feb. 21, 2023, corresponding to Application No. 2021-18239 with English translation, 17 pages.

Examination Report from the EPO dated Jul. 17, 2023, corresponding to European Patent Application No. 20 207 564.4-1201, 4 pages.

Japanese Office Action dated Sep. 19, 2023 with English translation, corresponding to Application No. 2021-182939, 10 pages.

Chinese First Office Action dated Dec. 13, 2023 with English translation, corresponding to Application No. 202111325507.0, 22 pages.

* cited by examiner

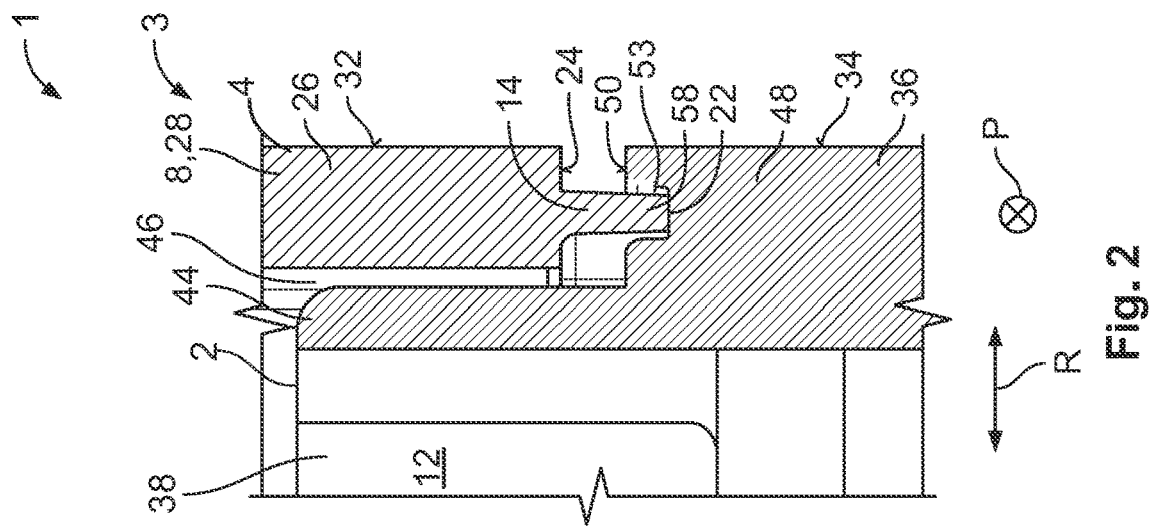
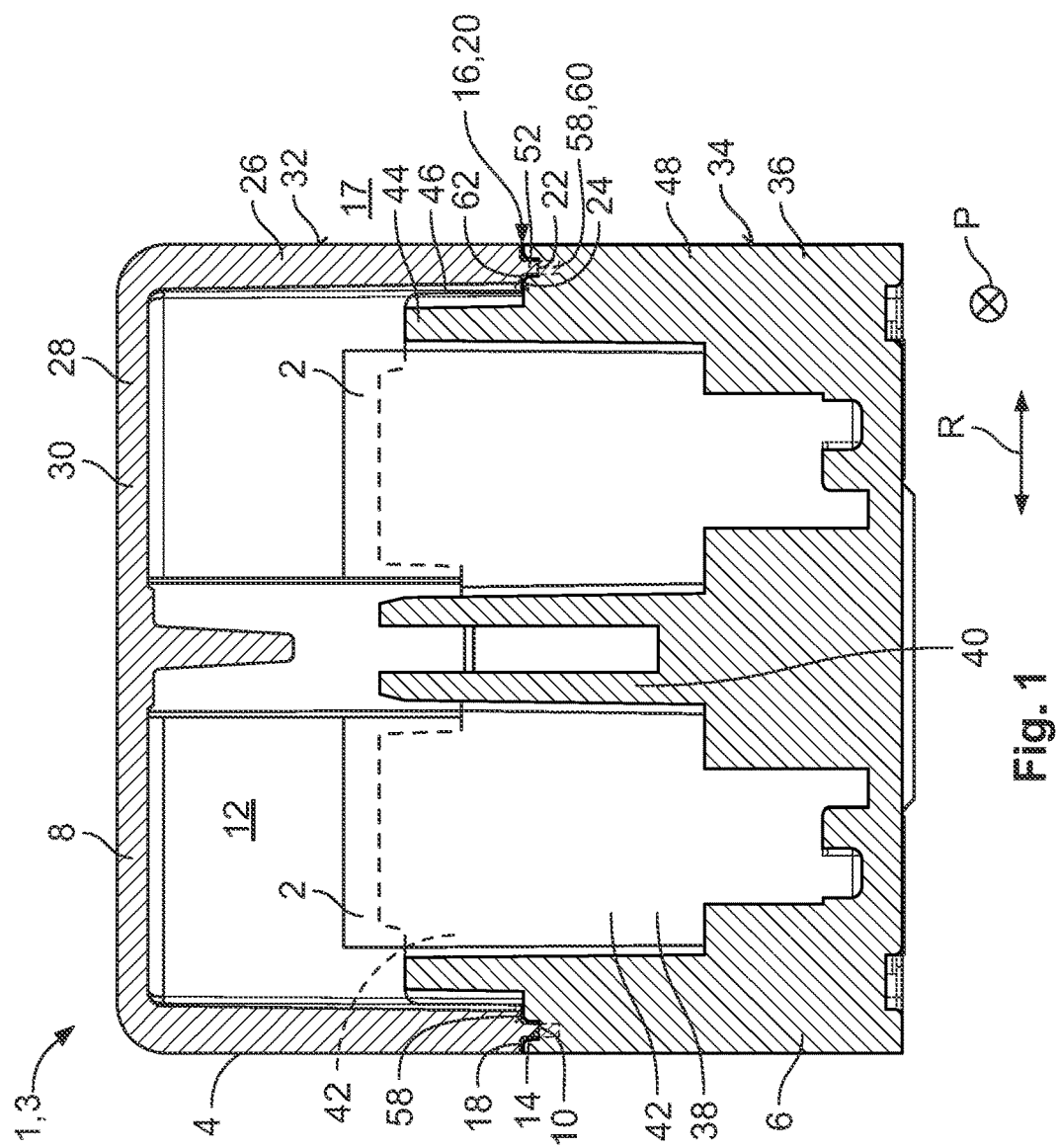

ELECTRIC DEVICE COMPRISING A SEALED HOUSING HAVING A LOWER HOUSING PART AND AN UPPER HOUSING PART

CROSS-REFERENCE TO RELATED APPLICATIONS

This application claims the benefit of the filing date under 35 U.S.C. § 119(a)-(d) of European Patent Application No. 20207564.4, filed on Nov. 13, 2020.

FIELD OF THE INVENTION

The present invention relates to an electric device and, more particularly, to an electric device with a sealed housing.

BACKGROUND

Electric devices with a sealed housing are often subjected to high inside pressure, which may occur due to high ambient and/or operating temperatures. Furthermore, fast temperature changes in combination with humidity inside the housing may also increase the inside pressure. The inside pressure may deform and/or damage the housing. Some applications require a high level of sealing, in order to protect the electric components within the housing and prevent a short circuit and/or contact failure.

The prior art teaches inserting the electric components into a housing part, closing the housing part with a planar cover, and sealing the housing with either temperature or UV hardening epoxies. The application of epoxies, however, is disadvantageous as the hardening process of the epoxies may apply high thermal stress on the product. Furthermore, the precise application of an epoxy is cumbersome and the epoxy flow has to be controlled by a variety of design elements on the housing parts, which may reduce the durability of the housing.

SUMMARY

An electric device includes an electric component and a housing having a lower housing part and an upper housing part. The electric component is supported on the lower housing part. The lower housing part and the upper housing part surround a housing volume in which the electric component is sealingly encased. A weld is formed between the upper housing part and the lower housing part. One of the lower housing part and the upper housing part has a protrusion welded to the other one of the lower housing part and the upper housing part. A gap is disposed between the lower housing part and the upper housing part, the gap extending radially from the protrusion to an outside of the housing. A solidified molten material from the weld is at least partially received in the gap.

BRIEF DESCRIPTION OF THE DRAWINGS

The invention will now be described by way of example with reference to the accompanying Figures, of which:

FIG. 1 is a sectional side view of an electric device according to an embodiment;

FIG. 2 is a detail sectional side view of the electric device of FIG. 1 before welding;

DETAILED DESCRIPTION OF THE EMBODIMENT(S)

Figure 4:
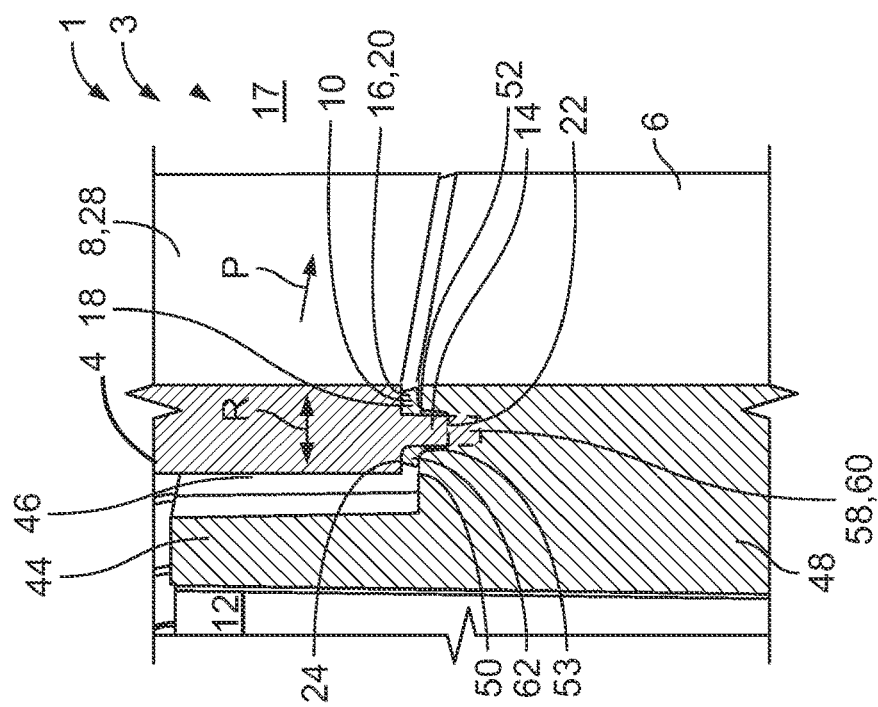
FIG. 4 is a detail sectional side view of the electric device of FIG. 1 after welding.

In the following, an electric device according to the invention is explained in greater detail with reference to the accompanying drawings, in which exemplary embodiments are shown. In the figures, the same reference numerals are used for elements which correspond to one another in terms of their function and/or structure. According to the description of the various aspects and embodiments, elements shown in the drawings can be omitted if the technical effects of those elements are not needed for a particular application, and vice versa: i.e., elements that are not shown or described with reference to the figures, but otherwise described herein, can be added if the technical effect of those particular elements is advantageous in a specific application.

First, an exemplary embodiment of the inventive electric device 1 is further explained in detail with reference to FIG. 1, which shows the electric device 1 in a schematic perspective view.

The electric device 1, as shown in FIG. 1, comprises electric components 2 and a housing 4. The housing 4 has a lower housing part 6, on which at least one of the electric components 2 is supported, and an upper housing part 8, wherein a weld 10 is formed between the lower housing part 6 and the upper housing part 8. The lower housing part 6 and the upper housing part 8 surround a housing volume 12, in which the electric components 2 are sealingly encased.

As shown in FIG. 1, one of the lower housing part 6 and the upper housing part 8 has a protrusion 14, which is welded to the respective other one of the lower housing part 6 and upper housing part 8. A gap 16 is provided between the lower housing part 6 and the upper housing part 8, the gap 16 extending radially from the protrusion 14 to outside 17 of the housing 4. Solidified molten material 18 of the weld 10 is received at least partially in the gap 16.

In FIG. 1, the electric components 2 are only schematically indicated. The electric device 1 may be a relay 3, whereby the electric components 2 may for example include a contact spring, a coil or the like.

The protrusion 14 as well as the solidified molten material 18 act as a barrier preventing any ingress of fluids into the housing 4 at an interface between upper housing part 8 and lower housing part 6 and therefore hermetically sealing the housing volume 12 encased by the housing parts 6, 8. Consequently, cumbersome application of epoxies for sealing is avoided. Hence, there is no need of design elements on the housing parts to direct the epoxies, which would reduce the durability of the housing parts. Particularly, the housing 4 may not be sealed with epoxies.

The gap 16, as shown in FIG. 1, extending radially from the protrusion 14 to the outside of the housing 4 acts as a collection chamber 20 for collecting excessive material formed during welding. The gap 16, at the same time, prevents additional welding zones being formed by the upper housing part 8 abutting the lower housing part 6 outside a predetermined welding zone 22 defined by the interface of the protrusion 14 and the respective other of the lower housing part 6 and the upper housing part 8. However, the molten material 18 of the protrusion 14 being received in the gap 16 bonds the lower and upper housing part 6, 8 to one another when solidifying and thus increases the surface area and strength of the weld 10.

It is to be noted that the radial direction R shown in FIG. 1 is not limited to a spherical housing. The housing 4 may also comprise a cuboid shape, in which case the radial direction R is to be understood as being essentially perpendicular to a peripheral direction P of the electric device 1.

As shown in FIG. 1, the protrusion 14 may be formed on a front face 24 of a sidewall 26 of the upper housing part 8. The upper housing part 8 may be a tub-shaped cover 28 having an upper wall 30 and the sidewall 26 extending essentially perpendicular from the upper wall 30 towards the lower housing part 6. In an embodiment, the sidewall 26 may be formed monolithically with the upper wall 30 and extend along a closed periphery. Consequently, further sealing between the sidewall 26 and upper wall 30 is no longer necessary.

In an embodiment, the protrusion 14 extends continuously in the peripheral direction P and thus also has a closed periphery. Therefore, the sealing provided by the weld 10 is the same at each position along the peripheral direction P, preventing any weak spots for fluid ingress.

The sidewall 26 may comprise an outer surface 32 facing the outside 17, which may be aligned with an outer surface 34 of a sidewall 36 of the lower housing part 6, in a plane essentially perpendicular to the radial direction R. In other words, the outer surfaces 32, 34 may be arranged on a common plane extending essentially perpendicular to the radial direction R. Consequently, no radially outward protruding step susceptible to chipping is formed between the upper housing part 8 and the lower housing part 6.

The lower housing part 6 may comprise compartments 38, in which the electric components 2 may be mounted. The compartments 38 may be separated from one another via ribs 40 or bulkhead walls 42, which are indicated with the phantom lines in FIG. 1. In order to limit the compartments 38 in the radially outward facing direction, an inner wall 44 may be provided, the inner wall 44 extending essentially parallel to the sidewalls 26 of the upper housing part 8 and projecting into a volume surrounded by the upper housing part 8, so that a slot-like pocket 46 is formed between the inner wall 44 and the sidewalls 26.

A radially protruding shoulder 48 protruding from the inner wall 44 may form the outwards facing sidewall 36 of the lower housing part 6, as shown in FIG. 1. Therefore, the sidewall 36 of the lower housing part 6 has an increased rigidity due to the high material thickness in the radial direction R. With the radially protruding shoulder 48, a front face 50 is provided facing the upper housing part 8, as shown in FIG. 2, such that the gap 16 may be formed between the respective front faces 24, 50 of the upper and lower housing parts 8, 6.

In order to further strengthen the weld 10, a notch 52 may be formed on the front face 50 of the lower housing part 6, the notch 52 at least partially receiving the protrusion 14 as shown in FIG. 1. Therefore, a tongue-groove weld may be formed between the notch 52 and the protrusion 14. The notch 52 may have a width in the radial direction R which is greater than a width of the protrusion in a radial direction 14, such that a space 53 shown in FIG. 2 is formed between notch 52 and protrusion 14, which is filled with the solidified molten material 18, providing a strong and durable weld 10 (see FIG. 4). A capillary effect ensures that the molten material 18 flows into the space 53 between the protrusion 14 and the notch 52.

As shown in FIG. 1, the gap 16 may be arranged at around mid-height of the housing 4, as both the lower housing part 6 and the upper housing part 8 are stabilized by their respective sidewalls 26, 36. In an embodiment, the gap 16 may be arranged between a quarter and three quarters of a height of the housing 4. The lower housing part 6 is further stabilized by the inner wall 44. Especially for housings 4 having a longitudinal body, such an embodiment may prove particularly advantageous, as bulging due to high inside pressure as well as distortion due to the welding process may be avoided. The durability of the housing and reliability of the welded seal may even be further increased when the gap 16 is arranged at mid-height of the housing 4. It should be noted that a deviation of an eighth from a center plane of the housing 4 arranged essentially parallel to the radial direction R is also considered as mid-height of the housing 4 within the context of this application.

Figure 3:
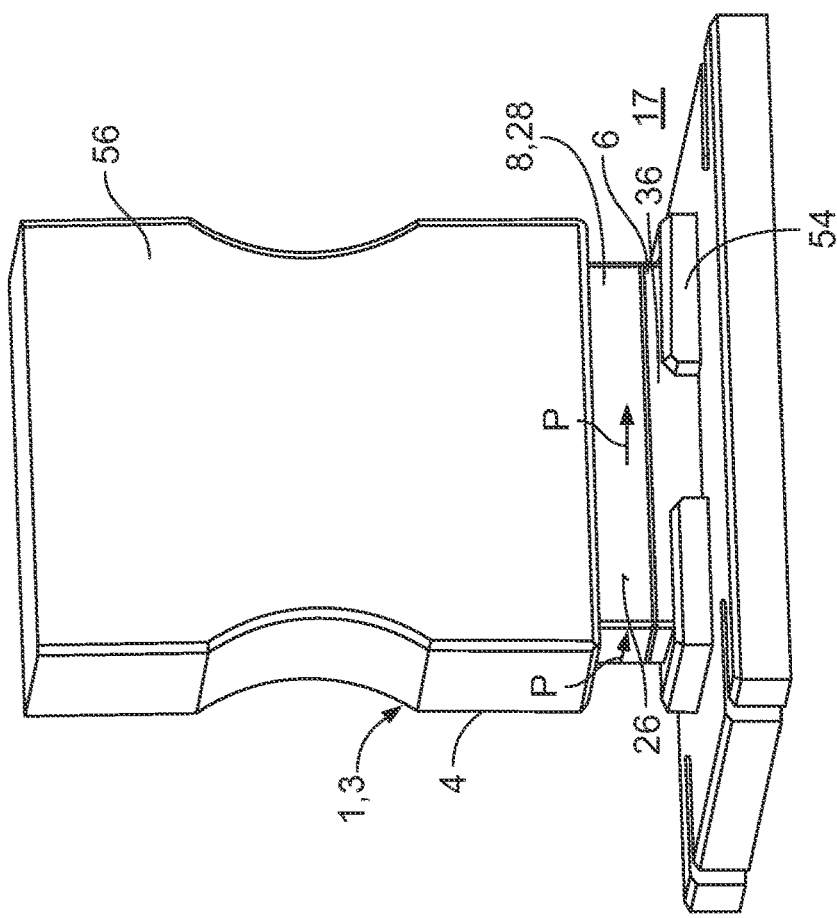
FIG. 3 is a perspective view of a housing of an electric device during welding.

Now, the welding process as well as the weld 10 is further discussed with references to FIGS. 2 to 4.

In FIG. 2, an enhanced section of the housing parts 6, 8 is shown before welding. As can be seen, only the protrusion 14 abuts the lower housing part 6, as a front face of the protrusion 14 is pressed against a bottom surface of the notch 52. Consequently, the welding zone may be restricted to said interface and generation of additional and unwanted molten material during the welding process may be prevented. Material melting at different areas other than the welding zone 22 of the protrusion 14 and the abutting surface is avoided. Said melting material at undesired additional areas may, for example, cause an overflow of molten material and/or an excessive release of reinforcement particles, such as glass fibers. This may negatively affect the product quality and even lead to contact failure of the electric components received in the housing volume, since there are no provisions to prevent a direct flow of the molten material and/or the reinforcement particles to the electric components 2 or the outside 17 of the housing 4 at the additional welding zones.

The protrusion 14 may have a length that is larger than a depth of the notch 52, so that the front faces 24, 50 are spaced apart from one another. In an embodiment, the protrusion 14 may be arranged at an essentially central position of the front face 24 in the radial direction R, such that a part of the front face 24 extends radially inwards or radially outwards beyond the protrusion 14.

When the upper housing part 8 and the lower housing part 6 are formed from different materials such as plastic and metal or a thermoplastic and a thermoplastic elastomer, the weld 10 may be formed by laser welding.

If the addition of a supplementary welding material should be avoided, the housing parts 6, 8 may be welded to one another via ultrasonic welding. Such a process is shown in FIG. 3. For this, the lower housing part 6 may be mounted securely on a base platform 54 and the upper housing part 8 is placed onto the lower housing part 6. A sonotrode 56 presses the upper housing part 8 towards the lower housing part 6, while simultaneously emitting a low-amplitude acoustic vibration of about 20 to 25 kHz or even up to 50 kHz. Due to the vibration, high friction is generated between the abutting parts of the housing parts 6, 8, which in this case is a front face of the protrusion 14 and a bottom surface of the notch 52. Ultrasonic welding is particularly advantageous as only the components that directly abut one another form a vibration barrier, causing vibration energy to be absorbed and converted into heat. This friction causes only a tip 58 of the protrusion 14 to melt, so that the thermal stress is limited to a relatively small zone, without affecting the characteristics of the remainder of the housing parts 6, 8. In FIGS. 1 and 4, said molten tip 58 is indicated with phantom lines and comprises a predetermined volume 60, which can be determined by the depth that the housing parts 6, 8 are pressed towards one another and the duration of the welding process. Due to the focused energy input, extremely short welding times may be achieved.

During welding, particularly ultrasonic welding, the vibrational strain on the sidewall 36 of the lower housing part 6 may be compensated by the increased rigidity due to the high material thickness of the shoulder 48, preventing any damage to the housing part 6 and thus further reducing the risk of production faults.

The molten material 18 fills up the space between protrusion 14 and notch 52. In an embodiment, the notch 52 opens into the gap 16, which may be formed between the opposing front faces 24, 50 of the housing parts 6, 8. Therefore, the molten material 18 may further flow into the gap 16 and weld the front faces 24, 50 to one another upon solidifying. Consequently, not only the protrusion 14 is welded to the notch 52, but also the front faces 24, 50 to one another, without directly abutting each other.

The gap 16 may be dimensioned such that a volume of the molten material 18, which can be predetermined by defining the welding time and/or depth at which the tip 58 of the protrusion 14 is pressed against the respective other one of the lower housing part 6 and upper housing part 8, is lower than the volume between the housing parts 6, 8. The volume between the housing parts 6, 8 may be defined as the sum of the space between protrusion 14 and notch 52, the volume of the gap 16 and the volume of any further gaps into which the molten material 18 may flow during welding.

As can be seen in FIGS. 2 and 4, the notch 52 may further open into an inner gap 62 opposite the gap 16 formed between the parts of the front faces 24, 50 extending radially inwards from the protrusion 14 and notch 52, respectively. With this additional inner gap 62, further formations of welding zones may be prevented. In an embodiment, only the protrusion 14 may directly abut the respective other one of the lower housing part 6 and upper housing part 8, so that the weld 10 can be further optimized and controlled. The occurrence of an additional welding zone may be prevented when after the welding process only the protrusion 14 abuts the respective other one of the lower housing part 6 and upper housing part 8.

The inner gap 62 may be arranged directly opposite the gap 16 relative to the protrusion 14, so that they extend along a common plane essentially parallel to the radial direction R, as shown in FIG. 4. Particles which arise during welding should be prevented from coming into contact with and damaging the electric components 2, therefore the inner gap 62 may open into the slot-like pocket 46. Thus, the inner wall 44 may act as a further barrier forming a maze-like pathway for the particles to come into contact with the electric components. In an embodiment, the width of the gap 16 and the inner gap 62, essentially perpendicular to the radial direction R and peripheral direction P, may be principally the same, in order to ensure an essentially homogeneous welding zone.

Molten material 18 can be collected at either side of the protrusion 14 without spilling into the housing volume 12 or out of the housing 4. By preventing the molten material 18 from flowing out of the housing 4, further processing steps, such as a cleaning step to provide a smooth outer surface may be avoided.

In an embodiment, the housing parts 6, 8 may be formed of a plastic material, which may be reinforced by glass fibers, for example, to increase rigidity. Therefore, a contact of the glass fibers with the electric components may be prevented, which may even cause a contact failure.

In order for the particles to reach the electric contacts 2 they need to flow from the welding zone 22 into the inner gap 62, where they are redirected radially inwards. This may slow the particle flow down so that the molten material 18 may catch up and trap the particles upon solidifying in the inner gap 62. Correspondingly, the particles trying to flow out of the housing 4 are redirected and eventually trapped in the gap 16.

The particles are further prevented from reaching the electric components 2 by the inner wall 44. The particles that manage to escape from the inner gap 62 are not directly lead to the electric components 2 in the housing volume 12. Instead, they are received in the slot-like pocket 46. A second redirection of the particles would be necessary for the particles to flow out of the slot-like pocket 46 beyond the inner wall 44 to the electric components 2. The particles flowing to the outside may cause irritation to surrounding people and/or may damage surrounding components. However, as the particles may be trapped in the gap 16, the particles are prevented from flowing to the outside, avoiding the need for additional safety equipment.

FIG. 4 shows the weld 10 of the assembled housing 4. The solidified molten material 18 may be received in both the inner gap 62 and the gap 16 forming an intermediate layer bonding the front faces 24, 50 of the housing parts 6, 8 to one another. The gap 16 and the inner gap 62 may extend radially beyond the solidified molten material 18, preventing any of the molten material 18 from spilling to the outside and thus requiring further processing steps for smoothening the outer surfaces 32, 34 after solidifying or potentially damaging the electric components 2. This may be achieved, for example, if the predetermined volume is smaller than the sum of a volume of the space between protrusion 14 and notch 52, a volume of the inner gap 62 after the welding process, and a volume of the gap 16 after the welding process.

A collection chamber 20 is provided both radially inwards and radially outwards from the welding zone 22. Therefore, the molten material 18 may be prevented from moving inside into the housing volume 12 and outside the housing 4, as it is securely confined in the inner gap 62 and the gap 16.

In a method for assembling a housing 4 of an electric device 1 according to an embodiment, the housing 4 comprises the lower housing part 6 for supporting at least one electric component 2 and the upper housing part 8, wherein one of the lower housing part 6 and the upper housing part 8 comprises the protrusion 14. The protrusion 14 is pressed against and welded to the respective other one of the lower housing part 6 and the upper housing part 8 and the gap 16 is formed between the lower housing part 6 and upper housing part 8 extending radially from the protrusion 14 to the outside of the housing 4. Molten material 18 from the welding process is at least partially received in the gap 16.

It is possible to clearly identify the inventive electric device 1 via common structural analysis, such as plastography or X-ray testing. The solidified molten material 18 will be apparent due to its different microstructure. For example, the orientation of the particles and density of the solidified molten material 18 can be different to that of the protrusion 14 and the respective housing parts 6, 8. Consequently, the solidified molten material 18 can be distinguished from the protrusion 14 and the respective housing parts 6, 8 and it is thus possible to verify the protrusion 14 being welded to the respective other one of the lower housing part 6 and upper housing part 8 as well as the presence of the solidified molten material 18 in the gap 16 between the lower housing part 6 and upper housing part 8.

The electric device 1 according to the various embodiments is easily manufactured and has a durable sealed housing 4.

In an embodiment, the upper housing part 8 and/or the lower housing part 6 does not comprise a limitation surface to define the distance at which the housing parts 6, 8 are pushed towards each other during the welding process, i.e. until abutment of the limitation surface to the respective other one of the lower housing part 6 and upper housing part 8. The distance may instead be determined directly by the welding process, e.g. via the welding time and pushing force. The omission of the limitation surface has the further advantage in that the gaps 16, 62 are not being closed by the limitation surface preventing squeezing out of the molten material 18 arranged in the gap 16, 62 during welding.

What is claimed is:

1. An electric device, comprising:
an electric component; and
a housing having a lower housing part and an upper housing part, the electric component is supported on the lower housing part, the lower housing part and the upper housing part surround a housing volume in which the electric component is sealingly encased, a weld is formed between the upper housing part and the lower housing part, one of the lower housing part and the upper housing part has a protrusion welded to another one of the lower housing part and the upper housing part, a gap is disposed between the lower housing part and the upper housing part, the gap extending radially outward from the protrusion to an outside of the housing and radially inward to an inner side of the housing, a solidified molten material from the weld is at least partially received in the gap, wherein:
the protrusion is received in a notch of the other one of the lower housing part and the upper housing part, the notch defining interior surfaces opposing one another in a radial direction;
the lower housing part and the upper housing part are completely separated from one another in an axial direction perpendicular to the radial direction except where a surface of the protrusion directly abuts an opposing surface of the other one of the lower housing part and the upper housing part in the axial direction, and the solidified molten material from the weld connects the upper housing part and the lower housing part.

2. The electric device of claim 1, wherein the protrusion extends continuously along an entire front face of the lower housing part or the upper housing part and has a closed periphery.

3. The electric device of claim 1, wherein the weld is arranged directly between the protrusion and the notch in a radial direction.

4. The electric device of claim 1, wherein the weld is an ultrasonic weld formed between the lower housing part and the upper housing part.

5. The electric device of claim 1, wherein the gap extends in a radial direction beyond the weld.

6. The electric device of claim 1, wherein an inner gap is formed between the lower housing part and the upper housing part opposite the gap relative to the protrusion.

7. The electric device of claim 6, wherein the inner gap extends radially from the protrusion to the housing volume.

8. The electric device of claim 7, wherein the inner gap opens radially into a slot-like pocket between an outer sidewall of one of the lower housing part and the upper housing part and an inner wall of the other one of the lower housing part and the upper housing part.

9. The electric device of claim 8, wherein the inner wall is arranged in the housing volume and extends essentially parallel to the outer sidewall.

10. The electric device of claim 7, wherein the protrusion is received in the notch of the other one of the lower housing part and the upper housing part, the notch opens into the gap and/or the inner gap.

11. The electric device of claim 1, wherein the gap is arranged between a quarter and three quarters of a height of the housing.

12. The electric device of claim 1, wherein the gap is arranged at a mid-height of the housing.

13. The electric device of claim 1, wherein an outer surface of the upper housing part is aligned with an outer surface of the lower housing part.

14. The electric device of claim 1, wherein a height of the gap between the lower housing part and the upper housing part is smaller than a length of the gap in a radial direction.

15. The electric device of claim 1, wherein only the protrusion and the solidified molten material from the weld directly abut the other one of the lower housing part and the upper housing part.

16. The electric device of claim 1, wherein the interior surfaces defining the notch oppose each of two lateral sides of the protrusion.

17. A method for manufacturing a sealed housing, comprising:
providing a housing having a lower housing part and an upper housing part, one of the lower housing part and the upper housing part has a protrusion, a gap is disposed between the lower housing part and the upper housing part extending radially from the protrusion to an inside and an outside of the housing; and
welding the protrusion to another one of the lower housing part and the upper housing part, wherein:
only the protrusion and a solidified molten material from the weld directly abut the other one of the lower housing part and the upper housing part; and;
the lower housing part and the upper housing part are completely separated from one another in an axial direction perpendicular to the radial direction except where a surface of the protrusion directly abuts an opposing surface of the other one of the lower housing part and the upper housing part in the axial direction, and the solidified molten material from the weld connects the upper housing part and the lower housing part.

18. The method of claim 17, further comprising providing an electric component supported on the lower housing part.

19. The method of claim 17, wherein a predetermined volume of a tip of the protrusion is melted during the welding step, the predetermined volume is lower than a volume between a front face of the lower housing part and a front face of the upper housing part.

20. The method of claim 17, wherein the lower housing part and the upper housing part are completely separated from one another in a radial direction except where the solidified molten material from the weld connects the upper housing part and the lower housing part.

21. A housing, comprising:
a lower housing part; and
an upper housing part having a protrusion welded at a weld to the lower housing part, a gap disposed between the lower housing part and the upper housing part extends radially from the protrusion to an outside of the lower housing part and the upper housing part, the weld has a solidified molten material at least partially received in the gap, wherein the protrusion is received in a notch of another one of the lower housing part and the upper housing part, the notch defining opposing interior surfaces opposing the protrusion in a radially inward direction and a radially outward direction, wherein the lower housing part and the upper housing part are completely separated from one another in an axial direction perpendicular to the radial direction except where a surface of the protrusion directly abuts an opposing surface of the other one of the lower housing part and the upper housing part in the axial direction, and the solidified molten material from the weld connects the upper housing part and the lower housing part.

* * * * *